(12) United States Patent
Ispas et al.

(10) Patent No.: US 11,095,290 B2
(45) Date of Patent: Aug. 17, 2021

(54) CLOCK RECOVERY METHOD AND CLOCK RECOVERY MODULE

(71) Applicant: Rohde & Schwarz GmbH & Co. KG, Munich (DE)

(72) Inventors: Adrian Ispas, Munich (DE); Bernhard Nitsch, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 31 days.

(21) Appl. No.: 16/777,616

(22) Filed: Jan. 30, 2020

(65) Prior Publication Data
US 2020/0244273 A1    Jul. 30, 2020

Related U.S. Application Data

(63) Continuation-in-part of application No. 16/693,094, filed on Nov. 22, 2019.

(30) Foreign Application Priority Data

Nov. 22, 2018 (EP) .................................. 18207909
Dec. 4, 2018 (EP) .................................. 18210250

(51) Int. Cl.
| | | |
|---|---|---|
| H03L 7/08 | (2006.01) | |
| H03L 7/07 | (2006.01) | |
| G11C 7/10 | (2006.01) | |
| G11C 7/22 | (2006.01) | |
| H03L 7/087 | (2006.01) | |

(52) U.S. Cl.
CPC .......... *H03L 7/0807* (2013.01); *G11C 7/1051* (2013.01); *G11C 7/222* (2013.01); *H03L 7/07* (2013.01); *H03L 7/087* (2013.01)

(58) Field of Classification Search
None
See application file for complete search history.

(56) References Cited

U.S. PATENT DOCUMENTS

| | | |
|---|---|---|
| 5,295,155 A | 3/1994 | Gersbach et al. |
| 10,484,167 B2 * | 11/2019 | Zhuang ................. H03L 7/0807 |
| 2004/0123018 A1 | 6/2004 | Miller et al. |
| 2010/0141308 A1 | 6/2010 | Villarino-Villa et al. |
| 2020/0028662 A1 * | 1/2020 | Brown ................. H04L 7/0091 |

* cited by examiner

*Primary Examiner* — Cassandra F Cox
(74) *Attorney, Agent, or Firm* — Christensen O'Connor Johnson Kindness PLLC

(57) ABSTRACT

A clock recovery method for recovering a clock signal from a data signal is described, wherein the data signal comprises a symbol sequence. The clock recovery method comprises the following steps: The data signal is received. At least two partial clock timings of a partial clock signal that is based on the data signal are determined. The number of symbols between the at least two partial clock timings is determined. Clock timings of the clock signal are determined based on the at least two partial clock timings and the number of symbols. Further, a clock recovery module is described.

20 Claims, 6 Drawing Sheets

CLOCK RECOVERY METHOD AND CLOCK RECOVERY MODULE

CROSS-REFERENCE TO RELATED APPLICATION

This application is a continuation-in-part of U.S. patent application Ser. No. 16/693,094, filed Nov. 22, 2019, which claims priority to European Patent Application No. 18207909.5, filed Nov. 22, 2018, and European Patent Application No. 18210250.9, filed Dec. 4, 2018, all the disclosures of which are incorporated herein in their entirety.

FIELD OF THE DISCLOSURE

Embodiments of the present disclosure generally relate to a clock recovery method for recovering a clock signal from a data signal. Embodiments of the present disclosure further relate to a clock recovery module for recovering a clock signal from a data signal.

BACKGROUND

Several serial transmission protocols, for example transmission protocols for high data rates, do not have a dedicated clock signal so that a clock data recovery (CDR) based on the data signal is required.

In the state of the art, clock data recovery is done by means of a phase-locked loop (PLL) based clock data recovery. Typically, analog components are used in order to avoid major delays in the feedbacks done by the PLL based clock recovery, which might have an impact on the function and stability of the respective system used for clock data recovery.

In addition, digital solutions for clock data recovery are known in the state of the art.

For instance, phase interpolation techniques are used wherein the phase or rather the phase position of the clock signal is corrected in a feedback-controlled manner. The phase information of the data signal as well as the one of the clock signal are compared and used for controlling a phase interpolation. Thus, the respective information gathered is used for reconstructing the clock signal. The phase interpolation techniques ensure to track frequency shifts, for instance frequency shifts that occur in spread spectrum clocking (SSC) modulations. However, the technique is critical with regard to latency due to the feedback.

Another concept is based on sampling the data signal with a high sampling rate in an uncontrolled manner, also called blind oversampling. Edges in the data signal are detected which are used for determining the sampling times for generating the clock signal and recovering the respective data. However, this approach may not be capable of recovering the clock in real time if the data signal has a high data rate.

Accordingly, there is a need for a possibility enabling clock data recovery for n-ary serial signals, e.g. PAM-n signals, at high data rates with a large area of application.

SUMMARY

Embodiments of the present disclosure provide a clock recovery method for recovering a clock signal from a data signal, wherein the data signal comprises a symbol sequence. In an embodiment, the clock recovery method comprises the following steps: The data signal is received. At least two partial clock timings of a partial clock signal that is based on the data signal are determined. The number of symbols between the at least two partial clock timings is determined. Clock timings of the clock signal are determined based on the at least two partial clock timings and the number of symbols.

The clock recovery method according to the present disclosure is based on the idea to not directly recover all clock timings of the clock signal based on the data edges, as this might be computationally expensive. Instead, a partial clock recovery is done first.

Thus, the partial clock signal, which typically has a lower frequency than the clock signal, is determined first.

The partial clock timings each coincide with one respective clock timing, but there are more clock timings than there are partial clock timings. More precisely, usually there are one or more clock timings between each pair of consecutive partial clock timings. However, in exceptional cases, there may be no clock timing between a pair of consecutive partial clock timings.

Afterwards, the clock timings of the clock signal are determined based on the partial clock timings and based on the number of symbols between at least two partial clock timings, each of which can be determined in a computationally less expensive way compared to directly recovering the full clock signal.

Thus, the clock timings or rather the clock signal can be recovered with less computational effort compared to the state-of-the-art.

According to an aspect of the present disclosure, the clock timings are interpolated based on the at least two partial clock timings and the number of symbols. Thus, the clock timings or rather the clock signal can be recovered in a computationally efficient way, namely by an interpolation of the partial clock signal based on the partial clock timings and the number of symbols.

According to another aspect of the present disclosure, the clock timings are linearly interpolated. A linear interpolation is particularly economical with respect to required computational power.

In an embodiment of the present disclosure, the number of symbols is determined based on a pre-defined symbol period and/or an estimated symbol period. The symbol period may be estimated based on the data signal, for example based on signal edge timings of signal edges of the data signal. In some embodiments, the symbol period may be estimated via a post-processing unit. In addition, the symbol period may be estimated by a symbol period calculation module. The symbol period may be estimated by applying a criterion to be fulfilled.

If the pre-defined symbol period is employed, the pre-defined symbol period may be loaded from a memory. In this case, a nominal symbol period may be used.

In another embodiment of the present disclosure, signal edge timings of the data signal are determined, and wherein the at least two partial clock timings are determined based on the signal edge timings. Generally speaking, the signal edge timings correspond to the temporal signal edge positions in the data signal, namely the positions of data signal threshold transitions or level transitions. Thus, the partial clock timings may be determined based on threshold or level transitions.

In some embodiments, at least one histogram of the signal edge timings is determined, wherein the at least one histogram is associated with a preliminary set of partial clock timings, and wherein the at least two partial clock timings are determined based on the histogram.

Generally speaking, the at least one histogram indicates deviations of the partial clock timings from their supposed temporal position. More precisely, the at least one histogram is a distribution of the frequentness of deviations of the partial clock signals from their supposed temporal position plotted against the value of the deviation.

The preliminary set of partial clock timings represents a hypothesis about the partial clock signal. If this hypothesis matches timings defined by the signal edge timings, for example the signal edge timings themselves, the mean deviation, for example a mean absolute error and/or a mean quadratic error, of the partial clock timings from their supposed temporal position is smaller than in the case if the hypothesis does not match the timings defined by the signal edge timings. Thus, the histogram changes depending on how well the hypothesis matches the timings defined by the signal edge timings.

According to another aspect of the present disclosure, several histograms are determined, wherein each histogram is associated with one of several different preliminary sets of partial clock timings. The several different histograms each represent one hypothesis about the partial clock signal, wherein the individual hypotheses are different from each other. Thus, several different hypotheses about the partial clock signal may be compared with each other based on the respective histograms, and one of the hypotheses may be chosen based on the comparison.

In another embodiment of the present disclosure, the several histograms are compared with each other based on at least one characteristic parameter of the histograms, and wherein the at least two partial clock timings are determined based on the comparison. The characteristic parameter provides a measure for how well the hypothesis about the partial clock signal matches the timings defined by the signal edge timings. For example, the characteristic parameter provides a measure of a mean deviation of the hypothetic partial clock timings from the timings defined by the signal edge timings. In some embodiments, the characteristic parameter comprises a mean quadratic error and/or a mean absolute error.

According to an aspect of the present disclosure, the at least two partial clock timings are determined based on the histogram having an extremal characteristic parameter. As already mentioned above, the characteristic parameter provides a measure for how well the hypothesis about the partial clock signal matches the timings defined by the signal edge timings. Thus, depending on the specific definition of the characteristic parameter, the histogram having the smallest or largest characteristic parameter of all histograms is associated with the hypothesis that matches the timings defined by the signal edge timings best. In other words, the histogram having the optimal characteristic parameter is associated with the hypothesis that matches the timings defined by the signal edge timings best.

The signal edge timings of the data signal, the at least two partial clock timings and/or the number of symbols may be determined via a hardware partial clock recovery circuit or module. Thus, the hardware partial clock recovery module may comprise components, for example field programmable gate arrays (FPGAs) and/or application-specific integrated circuits (ASICs), that are configured to perform the respective steps of the clock recovery method described above. As is well known, hardware integration provides the advantage of a high processing speed, with the trade-off of a higher production cost. Accordingly, a hardware integration might ensure real-time processing. As only a partial clock signal is to be determined via the hardware partial clock recovery module, a high processing speed and lowered production costs are achieved at the same time.

The clock timings of the clock signal may be determined via a software interpolation circuit or module. Thus, the interpolation circuit or module may comprise a computer program having program code, computer program product or other means that are configured to perform at least some of the steps of the clock recovery method described above.

More precisely, the software interpolation module may determine the clock timings of the clock signal based on the at least two partial clock timings and the number of symbols between the at least two partial clock timings. In some embodiments, the software interpolation module may determine the clock timings via interpolation, for example via linear interpolation of the at least two partial clock timings based on the number of symbols between the at least two partial clock timings.

Alternatively or additionally, the interpolation circuit or module may be established as a hardware module. The purpose of the hardware interpolation module is the same as described above. However, the hardware implementation enhances the processing speed of the interpolation module, at the trade-off of a higher production cost.

Embodiments of the present disclosure further provide a clock recovery circuit or module for recovering a clock signal from a data signal, wherein the data signal comprises a symbol sequence. The clock recovery module has a partial clock recovery circuit or module and an interpolation circuit or module. The partial clock recovery module is configured to determine at least two partial clock timings of a partial clock signal based on the data signal. The partial clock recovery module is configured to determine the number of symbols between the at least two partial clock timings. The interpolation module is configured to determine clock timings of the clock signal based on the at least two partial clock timings and the number of symbols.

The clock recovery module according to the present disclosure is based on the idea to not directly recover all clock timings of the clock signal based on the data edges, as this might be computationally expensive. Instead, a partial clock recovery is done first.

Thus, the partial clock signal, which typically has a lower frequency than the clock signal, is determined first.

The partial clock timings each coincide with one respective clock timing, but there are more clock timings than there are partial clock timings. More precisely, usually there are one or more clock timings between each pair of consecutive partial clock timings. However, in exceptional cases, there may be no clock timing between a pair of consecutive partial clock timings.

Afterwards, the clock timings of the clock signal are determined based on the partial clock timings and based on the number of symbols between at least two partial clock timings, each of which can be determined in a computationally less expensive way compared to directly recovering the full clock signal.

Thus, the clock timings or rather the clock signal can be recovered with less computational effort compared to the state-of-the-art.

Regarding the remaining properties and advantages of the clock recovery module, reference is made to the explanations given above with respect to the clock recovery method, which also apply for the clock recovery module and vice versa.

In some embodiments, the clock recovery module is configured to perform the clock recovery method described above.

According to an aspect of the present disclosure, the interpolation module is established as a software module. Thus, the interpolation module may comprise a computer program having program code, computer program product or other means that are configured to perform at least some of the steps of the clock recovery method described above.

Alternatively or additionally, the interpolation module may be established as a hardware module. The purpose of the hardware interpolation module is the same as described above. However, the hardware implementation enhances the processing speed of the interpolation module, at the trade-off of a higher production cost.

According to another aspect of the present disclosure, the interpolation module is configured to interpolate the clock timings based on the at least two partial clock timings and the number of symbols. Thus, the clock timings or rather the clock signal can be recovered in a computationally efficient way, namely by the interpolation of the partial clock signal based on the partial clock timings and the number of symbols.

In an embodiment of the present disclosure, the partial clock recovery module is configured to determine signal edge timings of the data signal. Generally speaking, the signal edge timings correspond to the temporal signal edge positions in the data signal, namely the positions of data signal threshold transitions or level transitions. Thus, the partial clock timings may be determined based on threshold or level transitions.

In some embodiments, the partial clock recovery module is established as a hardware module. Thus, the hardware partial clock recovery module may comprise components, for example field programmable gate arrays (FPGAs) and/or application-specific integrated circuits (ASICs), that are configured to perform the respective steps of the clock recovery method described above. As is well known, hardware integration provides the advantage of a high processing speed, with the trade-off of a higher production cost. As only a partial clock signal is to be determined via the hardware partial clock recovery module, a high processing speed and lowered production costs are achieved at the same time.

According to another aspect of the present disclosure, the partial clock recovery module is configured to determine at least one histogram of the signal edge timings, the at least one histogram being associated with a preliminary set of partial clock timings, and wherein the at least two partial clock timings are determined based on the histogram. The at least one histogram describes deviations of the partial clock timings from their supposed temporal position. More precisely, the at least one histogram is a distribution of the frequentness of deviations of the partial clock signals from their supposed temporal position plotted against the value of the deviation. The frequentness of deviations may also be called presence of deviations or occurrence of deviations.

The set of partial clock timings represents a hypothesis about the partial clock signal. If this hypothesis matches the timings defined by the signal edge timings, then the mean deviation, for example the mean quadratic error and/or the mean absolute error of the partial clock timings from their supposed temporal position is smaller than in the case if the hypothesis does not match the timings defined by the signal edge timings. Thus, the histogram changes depending on how well the hypothesis matches the timings defined by the signal edge timings.

In a further embodiment of the present disclosure, the partial clock recovery module is configured to determine several histograms, wherein each histogram is associated with one of several different preliminary sets of partial clock timings.

In some embodiments, the partial clock recovery module is configured to compare the several histograms based on at least one characteristic parameter of the histograms. The characteristic parameter provides a measure for how well the hypothesis about the partial clock signal matches the timings defined by the signal edge timings. For example, the characteristic parameter provides a measure of a mean deviation of the hypothetic partial clock timings from the timings defined by the signal edge timings. In some embodiments, the characteristic parameter comprises a mean quadratic error and/or a mean absolute error.

According to another embodiment of the present disclosure, the partial clock recovery module is configured to determine the partial clock signal based on the comparison. In some embodiments, the partial clock recovery module choses the histogram that is associated with an extremal characteristic parameter. As already mentioned above, the characteristic parameter provides a measure for how well the hypothesis about the partial clock signal matches the timings defined by the signal edge timings. Thus, depending on the specific definition of the characteristic parameter, the histogram having the smallest or largest characteristic parameter of all histograms is associated with the hypothesis that matches the timings defined by the signal edge timings best. In other words, the histogram having the optimal characteristic parameter is associated with the hypothesis that matches the timings defined by the signal edge timings best.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
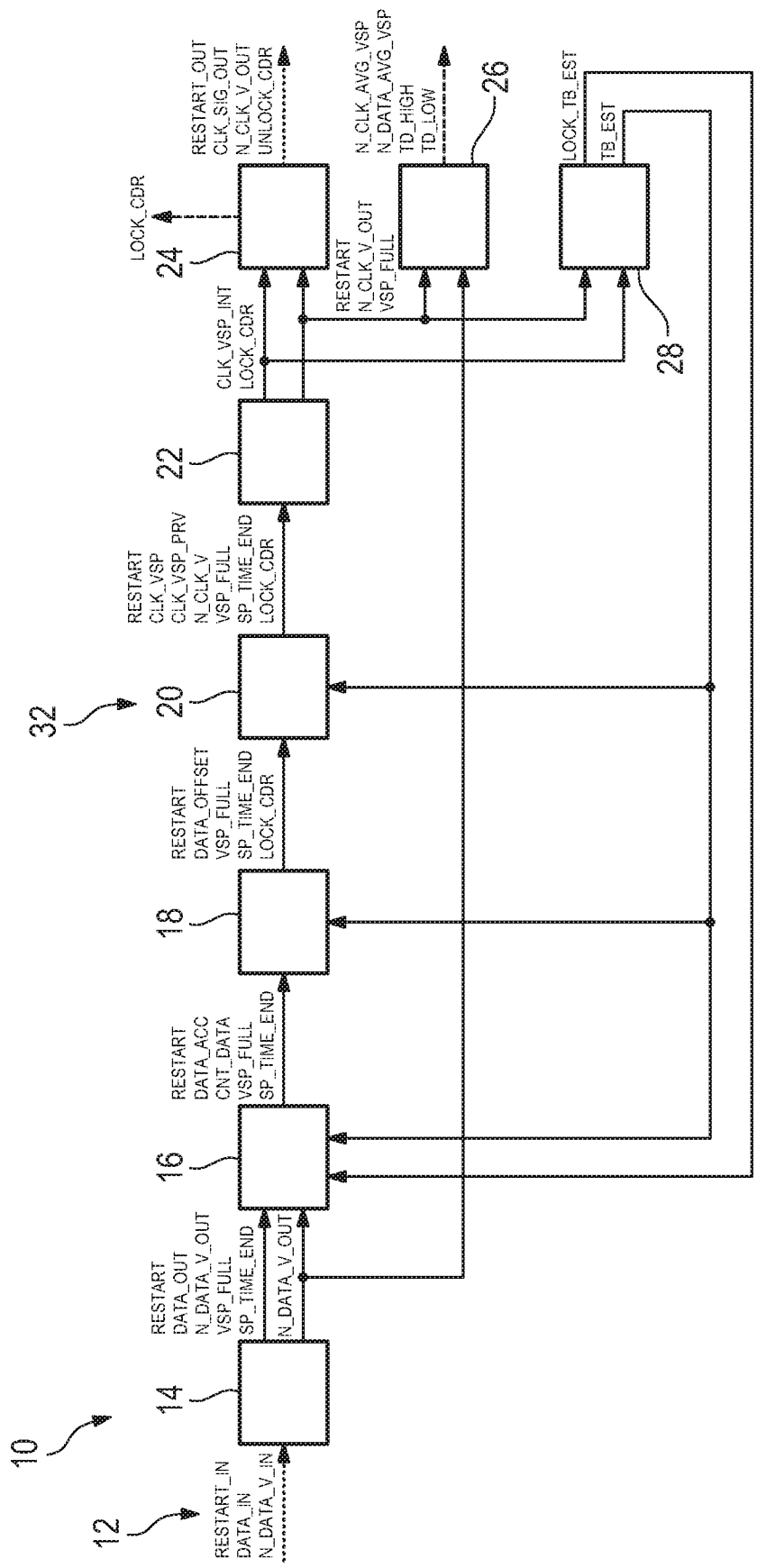
FIG. 1 schematically shows a representative clock recovery module according to an embodiment of the present disclosure.

In FIG. 1 a clock recovery module 10 is shown that has an input 12 via which a data signal to be processed is received. In the shown embodiment, the clock recovery module 10 has an optional virtualization and normalization module 14 that is connected with the input 12 so that the data signal received or rather respective information of the data signal is forwarded to the virtualization and normalization module 14. The data or rather information is received by the clock recovery module 10 so as to start recovering the clock signal from the data signal.

The clock recovery module 10 further comprises an accumulation and compensation calculation circuit or module 16 that is connected with the virtualization and normalization circuit or module 14. The accumulation and compensation calculation module 16 is inter alia configured to accumulate the edge timings of the data signal that are forwarded to the accumulation and compensation calculation module 16. Further, the accumulation and compensation calculation module 16 is configured to transform the edge timings accumulated into one reference bit period that is used for further processing as will be described later with respect to FIG. 2 when the overall method for recovering the clock signal from the data signal by using the clock recovery module 10 is described.

The clock recovery module 10 also comprises an offset selection circuit or module 18 that is connected with the accumulation and compensation calculation module 16 so as to receive at least the reference bit period determined previously. The offset selection module 18 is configured to determine a time offset for the reference bit period.

In addition, the clock recovery module 10 comprises a front clock generation circuit or module 20 that is connected with the offset selection module 18 so as to receive at least the time offset determined previously. The front clock generation module 20 is configured to determine a reference clock signal based on the time offset received. Further, the front clock generation module 20 is configured to determine the number of bits within a system clock of the clock recovery module 10.

The system clock may relate to the virtual system clock provided that the optional virtualization and normalization module 14 is provided.

The clock recovery module 10 further comprises a clock circuit or module 22 that is connected with the front clock generation module 20. The clock module 22 is configured to receive the number of bits determined by the front clock generation module 20 as well as the reference clock signal determined by the front clock generation module 20. Thus, the number of bits determined as well as the reference clock signal are forwarded to the clock module 22. The clock module 22 may be a clock interpolation module.

The clock recovery module 10 may have an optional de-normalization and de-virtualization circuit or module 24 that is connected with the clock module 22. In an embodiment, the de-normalization and de-virtualization module 24 is configured to reverse the result of the virtualization and normalization module 14. Accordingly, the optional de-normalization and de-virtualization module 24 is provided in case that the optional virtualization and normalization module 14 is provided.

In addition, the clock recovery module 10 may have an optional transition density calculation circuit or module 26 that is connected with the clock module 22 as well as the virtual and normalization module 14 being optional as discussed above. The transition density calculation module 26 is configured to determine a mean value of the clock signals and edge timings.

The clock recovery module 10 may optionally comprise a bit period calculation circuit or module 28 that is connected with the clock module 22. The bit period calculation module 28 is configured to feed back an estimated bit period to the accumulation and compensation calculation module 16, the offset selection module 18 and/or the front clock generation module 20.

Thus, the accumulation and compensation calculation module 16, the offset selection module 18 and/or the front clock generation module 20 may use the bit period estimated instead of the set one.

Figure 2:
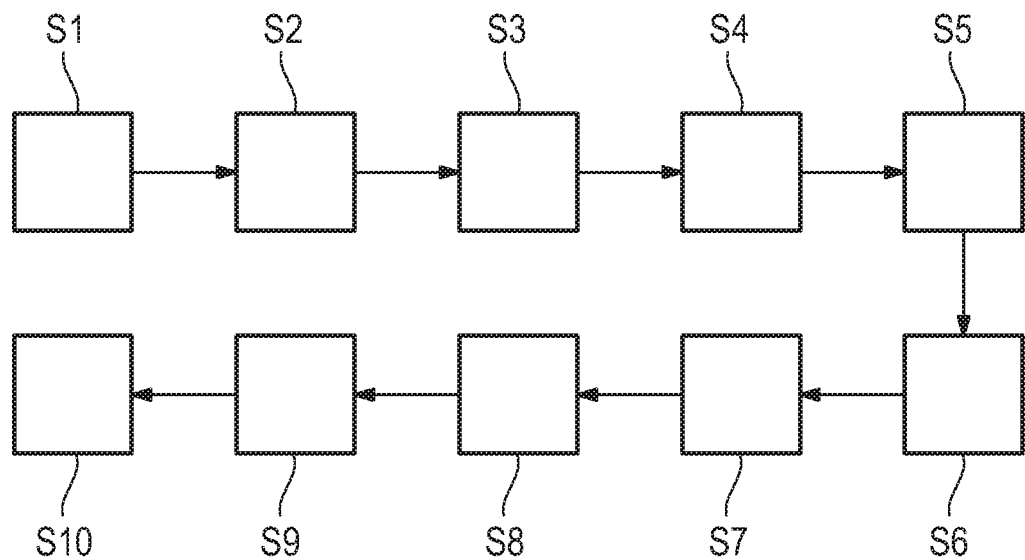
FIG. 2 shows a flow-chart illustrating a representative method for recovering a clock signal from a data signal according to an embodiment of the present disclosure.

Hereinafter, reference is made to FIG. 2 for describing an example method for recovering the clock signal from the data signal by using the clock recovery module 10 shown in FIG. 1, which is generally called clock data recovery (CDR).

In a general first step S1, thresholds for distinguishing the status of the binary data signal are defined, namely 0 and 1 of the data signal. Based on these thresholds, edge timings of the data signal are calculated, for instance the timings of exceeding or rather reaching the threshold(s) set. The respective edge timings are forwarded to the clock recovery module 10 via its input 12 as an input signal.

The clock signal timings, which define the clock signal, are recovered based on the edge timings of the data signal by using the clock recovery module 10 shown in FIG. 1 as will be discussed hereinafter in more detail.

In a second step S2, the virtualization and normalization module 14 receives via the input 12 the signal for resetting the clock data recovery (RESTART_IN), the number of valid edge timings $N_{Data,V}[k]$ (N_DATA_V_IN) in system clock k of the clock recovery module 10 as well as the respective edge timings $T_{Data}[k, l]$ with parallelism $P_{Data}$ (DATA_IN) wherein l=0, ..., $P_{Data}$−1 in samples.

The number of valid edge timings $N_{Data,V}[k]$ as well as the respective edge timings $T_{Data}[k, l]$ are calculated based on the thresholds set in step S1.

In some embodiments, the edge timings $T_{Data}[k, l]$ define the positions of the edges within the system clock with a sub-sample resolution.

The virtualization and normalization module 14 may generally summarize several system clocks to a virtual system clock, for example $2^{\mu_{VSP}}$ system clocks in case of data rates being lower than the system clock rate.

The edge timings are further normalized so that their respective positions correspond to the positions within the virtual system clock. The normalization can be done as follows:

$$\tilde{T}_{Data}[k,l]=(T_{VSP}[k]+T_{Data}[k,l])\cdot 2^{-\mu_{VSP}}$$

wherein $T_{VSP}[k]$ defines the offset of the current system clock, namely the k-th one, in the virtual system clock in samples.

The virtualization and normalization module 14 outputs the signal for resetting the clock data recovery (RESTART), the normalized edge timings $\tilde{T}_{Data}[k, l]$ (DATA_OUT), the number of edge timings $N_{Data,V}[k]$ (N_DATA_V_OUT), an indicator, marker or rather label for indicating the end of the virtual system clock (VSP_FULL) and an ending time of the current system clock (SP_TIME_END).

In the shown embodiment, the edge timings are forwarded after being normalized.

The respective data output is forwarded to the accumulation and compensation calculation module 16 as shown in FIG. 1.

Provided that no virtualization and normalization module 14 is provided, the edge timings $T_{Data}[k, l]$ would be forwarded to the accumulation and compensation calculation module 16 directly.

In a third step S3, the accumulation and compensation calculation module 16 receives the data output wherein $N_{Data,Acc}$ edges are accumulated and their respective values $T_{Acc}[k, l]$ are updated continuously, namely the positions of the edges within the (virtual) system clock or the positions of the edges within a bit period within the (virtual) system clock. In fact, the (virtual) system clock may comprise several bit periods. Put it another way, $N_{Data,Acc}$ edges are kept for further processing. The respective number may be set or rather pre-defined.

The accumulated edges $N_{Data,Acc}$ provide the basis for calculating the clock signal and, therefore, the number is of high importance with regard to the performance and resource consumption of the clock data recovery.

The accumulation and compensation calculation module 16 accumulates the last $N_{Data,Acc}$ edges received, which means that the respective number of edges $N_{Data,Acc}$ are kept.

Further, the accumulation and compensation calculation module 16 compensates the values of the edges in order to transform them into one reference bit period within the current (virtual) system clock by applying a modulo transformation.

New (non-negative) edge timings from the current system clock k are calculated by using the (standardized) bit period $\tilde{T}_b[k]$ as follows:

$$T_{Acc}[k,l] = \tilde{T}_{Data}[k,l] \bmod \tilde{T}_{Data}[k], \; l=0,\ldots,N_{Data,Acc}-1$$

If there is also a change to a new virtual system clock at the transition from system clock k−1 to system clock k, the existing accumulated edge timings $T_{Acc}[k, l]$ are additionally updated with the number of samples per system clock $N_{Smp}$ as follows:

$$T_{Acc}[k,l] = (T_{Acc}[k-1,l] - N_{Smp}) \bmod \tilde{T}_b[k], \; l=0,\ldots,N_{Data,Acc}-1$$

Figure 4A:
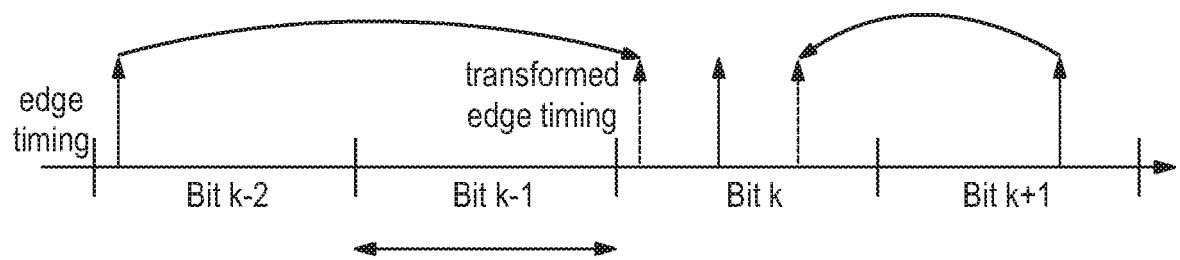
FIGS. 4a and 4b show an overview illustrating several steps of the method of FIG. 2.

The modulo transformation to one bit period interval allows a statistical evaluation of the edge timings within a single bit period as shown in FIG. 4a.

The accumulated edge timings $T_{Acc}[k, l]$ (DATA_ACC) as well as their number (CNT_DATA) are output by the accumulation and compensation calculation module 16 so that the following offset selection module 18 is enabled to process the respective data.

Besides the accumulated edge timings $T_{Acc}[k, l]$ (DATA_ACC) and their number (CNT_DATA), the accumulation and compensation calculation module 16 also outputs the signal for resetting the clock data recovery (RESTART), the indicator for indicating the end of the virtual system clock (VSP_FULL) as well as the ending time of the current system clock (SP_TIME_END) as shown in FIG. 1.

In a fourth step S4, the offset selection module 18 receives and processes the output data of the accumulation and compensation calculation module 16.

The offset selection module 18 is configured to determine a time offset as the base value for the clock signal. In fact, the offset selection module 18 can access a number of different time offset values for evaluating purposes, namely $N_{Off}$ time offset values.

For each of these time offset values, the bit period interval is shifted appropriately. The edge timings $T_{Acc}[k, l]$ within the respective bit period interval are updated as follows:

$$T_{Corr,m}[k, l] = \left(T_{Acc}[k, l] + \frac{T_b[k]}{2} - T_{Off,m}\right) \bmod T_b[k],$$

$$l = 0, \ldots, N_{Data,Acc} - 1; m = 0, \ldots, N_{Off} - 1$$

Figure 4B:
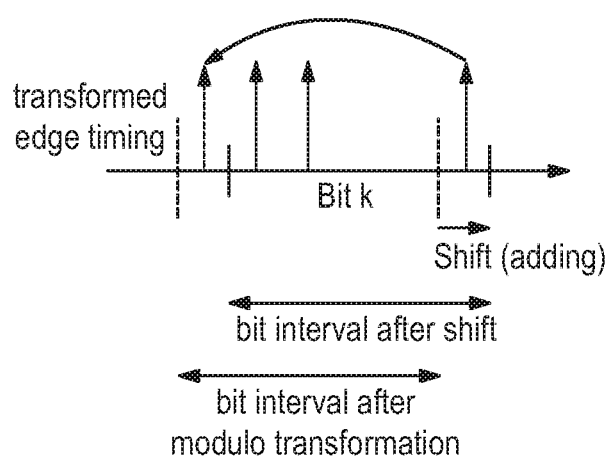

This principle is shown in FIG. 4b.

Thus, the time offset to be applied is chosen from a number of different time offsets by evaluating the difference of the accumulated edge timings $T_{Acc}[k, l]$ with respect to the center of the bit period interval $$\frac{\tilde{T}_b[k]}{2}$$

as shown hereinafter:

$$\Delta_{Corr,m}[k, l] = T_{Corr,m}[k, l] - \frac{T_b[k]}{2}, \; l = 0, \ldots, N_{Data,Acc} - 1$$

This can also be calculated as follows:

$$\Delta_{Corr,m}[k, l] = \begin{cases} T_{Acc}[k, l] - T_{Off,m}, & \text{if } T_{Acc}[k, l] - T_{Off,m} < \frac{T_b[k]}{2} \\ T_{Acc}[k, l] - T_{Off,m} - T_b[k], & \text{else} \end{cases}$$

$$l = 0, \ldots, N_{Data,Acc} - 1.$$

Then, the sum of the absolute values of these differences is created wherein the time offset value resulting yielding the lowest value is chosen according to:

$$s[k] = \underset{m}{\arg\min} \sum_{l=0}^{N_{Data,x}-1} |\Delta_{Corr,m}[k, l]|,$$

wherein $1 \leq N_{Data,x} \leq N_{DataAcc}$ and $x \in \{\text{Start, End}\}$.

At the beginning $N_{Data,x} = 1$, wherein $N_{Data,x} = N_{Data,Start}$ once $N_{Data,Start}$ have been accumulated. As soon as $N_{Data,End}$ edge timings have been accumulated and a defined number of system clock cycles $N_{Cyc,Sw}$ has expired, $N_{Data,x} = N_{Data,End}$ applies.

When changing to $N_{Dat,x} = N_{Data,End}$, the lock state of the CDR Lock$_{CDR}$ changes from 0 to 1. As soon as the lock state of the bit period estimate Lock$_{Tb}$ also changes from 0 to 1 at the input, the change Lock$_{CDR}$ changes from 1 to 2 and thus the lock state is reached.

Either the offset value $T_{Off,s}[k][k]$ can be used for further processing or the offset value determined can be corrected by adding the mean value of the differences. This allows a more accurate offset value to be obtained for the clock signal. The mean value of the differences may be added as follows to the offset value determined:

$$\check{T}_{Off}[k] = T_{Off,s[k]}[k] + \frac{1}{N_{Data,Acc}} \sum_{l=0}^{N_{Data,x}-1} \Delta_{Corr,m}[k,l]$$

The offset selection module 18 outputs at least the time offset determined $T_{Off,s}[k]$ [k] or rather the corrected time offset $\check{T}_{Off}[k]$ (DATA_OFFSET) as well as the lock status of the clock data recovery (LOCK_CDR) as shown in FIG. 1.

Besides the time offset determined $T_{Off,s}[k]$ [k] or rather the corrected time offset $\check{T}_{Off}[k]$ (DATA_OFFSET) as well as the lock status of the clock data recovery (LOCK_CDR), the offset selection module 18 also outputs the signal for resetting the clock data recovery (RESTART), the indicator for indicating the end of the virtual system clock (VSP_FULL) and the ending time of the current system clock (SP_TIME_END).

In a fifth step S5, the front clock generation module 20 receives the respective data and processes the data to determine the number of edges $N_{Clk,V}[k]$ within the (virtual) system clock as well as the value of the last edge timing $\tilde{T}_{Clk,last}[k]$ within the (virtual) system clock. The last edge timing $\tilde{T}_{Clk,last}[k]$ is assigned to the reference clock signal used for determining the clock signal.

The last edge timing $\tilde{T}_{Clk,last}[k]$ within the (virtual) system clock is calculated based on the basis value $T_{Base}[k] = \check{T}_{Off}[k] + \Delta_{Clk}$ and the standardized bit period $\tilde{T}_b[k]$. In fact, $\Delta_{Clk}$ corresponds to the offset of the clock signal with respect to the mean edge transition. Typically, $\Delta_{Clk} = \tilde{T}_0/2$ with the (standardized) nominal bit period $\tilde{T}_0$.

Figure 3:
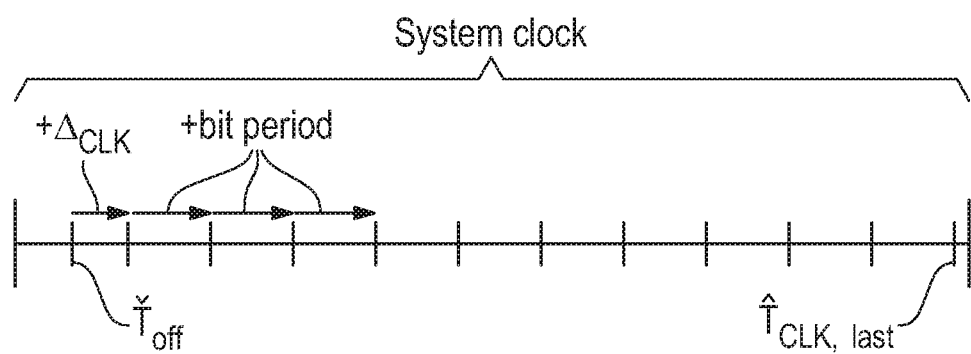
FIG. 3 shows an overview illustrating a processing step of the method shown in FIG. 2.

The respective calculation is also illustrated in FIG. 3. It becomes obvious that the last edge timing $\tilde{T}_{Clk,last}[k]$ within the (virtual) system clock corresponds to the reference clock signal. In fact, the last edge timing $T_{Clk,last}[k]$ is assigned to the last bit within the (virtual) system clock.

The distance between two clock timings must be $>\tilde{T}_b[k]/2$ and $\leq 3\tilde{T}_b[k]/2$. Accordingly, the first bit within the (virtual) system clock must be cancelled, remains or is added so as to obtain consistence between the previous (virtual) system clock and the current one.

Thus, the number of edges or rather edge timings $N_{Clk,V}[k]$ in the actual system clock can be obtained.

The front clock generation module 20 outputs inter alia the last edge timing $\tilde{T}_{Clk,last}[k]$ (CLK_VSP) within the current (virtual) system clock as well as the edge timing $\tilde{T}_{Clk,last}[k-2^{2\mu^{VSP}}]$ (CLK_VSP_PRV) of the previous (virtual) system clock as well as the number of edges $N_{Clk,V}[k]$ (N_CLK_V) as shown in FIG. 1.

Besides this data, the front clock generation module 20 also outputs the signal for resetting the clock data recovery (RESTART), the indicator for indicating the end of the virtual system clock (VSP_FULL), the ending time of the current system clock (SP_TIME_END) as well as the lock status of the clock data recovery (LOCK_CDR).

In a sixth step S6, the clock module 22 receives and processes the data appropriately.

Hence, the reference clock signals, namely the one assigned to the last edge timings, are used to determine the clock signal by interpolation provided that more than one clock signal is present in the system clock. The reference clock signal of the current system clock k as well as the one of the previous system clock k−1 are used and interpolated in a linear manner for generating the interposing clock signals:

$$\tilde{T}_{Clk}[k,l] = \tilde{T}_{Clk,last}[k-1] + (1+l)\frac{\tilde{T}_{Clk,last}[k] - \tilde{T}_{Clk,last}[k-1]}{N_{Clk,V}[k]},$$

$$l = 0, \ldots, P_{Clk} - 1$$

The respective clock signals $\tilde{T}_{Clk}[k]$ (CLK_VSP_INT) and their number (N_CLK_V_OUT) are output.

Provided that a normalization and virtualization module 14 was used as shown in the embodiment of FIG. 1, the respecting virtualization and normalization is reversed by the subsequent de-normalization and de-virtualization module 24 in a seventh step S7.

Hence, the de-normalization and de-virtualization provides clock signals that relate to the (non-virtual) system clock (CLK_SIG_OUT) which are output by the de-normalization and de-virtualization module 24 and obtained as follows:

$$T_{Clk}[k,l] = \tilde{T}_{Clk}[k,l] \cdot 2^{\mu^{VSP}} - T_{VSP}[k], l=0, \ldots, P_{Clk}-1$$

Furthermore, the unlock-status of the clock data recovery (UNLOCK_CDR) is output.

As shown in FIG. 1, the number of valid clock signals $N_{Clk,V}[k]$ (N_CLK_V_OUT), the signal for resetting the clock data recovery (RESTART_OUT) and the lock-status of the clock data recovery (UNLOCK_CDR) are output.

In an eighth step S8, the transition density calculation module 26 determines the mean number of the clock signals and edges. The calculation is done by means of an infinite impulse response filter (IIR filter) of first order as shown hereinafter:

$$\overline{N}_x[k] = (1-2^{-L}) \cdot \overline{N}_x[k-1] + 2^{-L} \cdot N_x[k]$$

wherein $x \in \{Data, Clock\}$, $L=3, \ldots, 15$, and wherein $N_x[k]$ corresponds to the number of clock signals or rather edges (N_CLK_AVG_VSP or rather N_DATA_AVG_VSP) within the current system clock.

Hence, the current system clock may comprise several bit periods, clock signals assigned to the bit periods or rather clock edges.

Furthermore, threshold(s) may be set to define a range of accepted values for the mean number of cycle signals or rather. In case of exceeding or rather falling below the threshold(s), an indication by means of $TD_{High}$ or rather $TD_{Low}$ is output (TD_HIGH or rather TD_LOW). Hence, breaching or rather violating the range of accepted values is indicated. The breaching or rather violating may be assigned to an exceeding or rather falling below the respective threshold(s).

In a ninth step S9, the optional bit period calculation module 28 may estimate a bit period that is fed back to the accumulation and compensation calculation module 16, the offset selection module 18 and/or the front clock generation module 20 as shown in FIG. 1. If no feedback occurs, the nominal (pre-set) bit period is used.

The feedback generally ensures the support of spread spectrum clocking (SSC) modulated signals where larger frequency shifts occur with slow changes. Due to the slow change of the bit period, the feedback is not latency critical.

The estimation of the bit period is done by an infinite impulse response filter (IIR filter) of first order wherein the distance $\Delta_{Clk}[k]$ between two clock signals is used for all $N_{Cyc,BPU}$ system clocks for updating purposes:

$$\hat{T}_b[k] = a \cdot \hat{T}_b[k - N_{Cyc,BPU}] + b \cdot \Delta_{Clk}[k]$$

The coefficients a and b are determined by the constant number of clock signals covered by the distance $\Delta_{Clk}[k]$ as well as the (desired) setting of the filter, for example its speed.

Besides the feedback of the estimated bit period $\hat{T}_b[k]$ (TB_TEST), the lock state of the bit period estimation Lock$_{Tb}$ (LOCK_TB_EST) is also forwarded to the accumulation and compensation calculation module 16. The status is only 1 in case of Lock$_{CDR}$≥1 and a defined number of clock signals N$_{Clk,Tb}$ has occurred after the last change from 0 to 1.

Once the clock signals have been recovered from the data signal based on the edge timings as described above, the data signal is sampled with the respective clock signals in a tenth step S10.

As the steps S7 to S9 are optional ones, the sampling may take place after the sixth step S6 once the clock signals were determined by the clock module 22.

Figure 6:
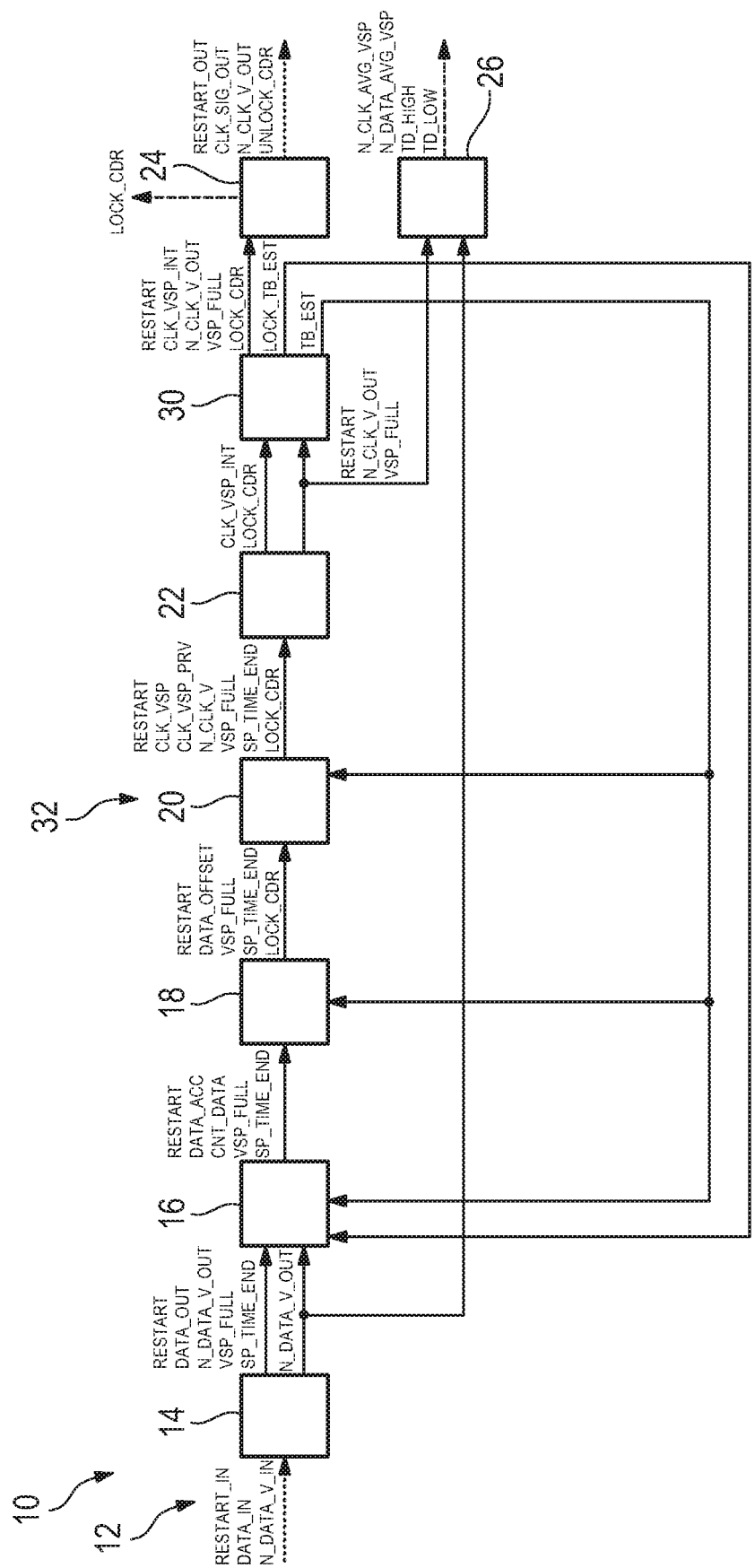
FIG. 6 shows a representative clock recovery module according to another embodiment.

In FIG. 6, another embodiment is shown that comprises a post-processing circuit or unit 30 instead of the bit period calculation module 28. The post-processing unit 30 is interconnected between the clock module 22 and the de-normalization and de-virtualization module 24.

The number of accumulated edge timings $T_{Acc}[k, 1]$ is limited yielding a high adaption speed of the clock data recovery with respect to the data signal which corresponds to a high bandwidth of a phase-locked loop (PLL). In general, this is advantageous for successful data recovery.

However, in case of a low bandwidth being desired, a post-processing is necessary.

The post-processing is based on an estimation of (standardized) clock signal timings $\tilde{T}_{Clk}$ as well as a (standardized) bit period $\tilde{T}_b$ of N (standardized) edge timings $\tilde{T}_{Data}[k]$, k=0, ..., N-1.

The estimation is separated in two optimization problems.

In some embodiments, a criterion is provided for the bit period and another criterion is provided for the (other) clock signal. For estimating the clock signal timing, the minimum of the following criterion has to be determined:

$$L_0(T_{Clk}) = \sum_{k=0}^{N-1} (T_{Data}[k] - T_{Clk} - n[k] \cdot T_b)^2,$$

wherein n[k] corresponds to the bit position of the k-th edge related to the clock signal. Thus, the clock signal timing $\tilde{T}_{Clk}$ is yield in dependency of the bit period $\tilde{T}_b$ as follows:

$$T_{Clk} = \frac{1}{N} \sum_{k=0}^{N-1} (T_{Data}[k] - n[k] \cdot T_b)$$

For estimating the bit period $\tilde{T}_b$, the minimum of the following criterion (for even N) is to be determined:

$$L_1(T_b) = \sum_{k=0}^{N/2-1} ((T_{Data}[k] - T_{Data}[k+N/2]) - (n[k] - n[k+N/2]) \cdot T_b)^2$$

The bit period $\tilde{T}_b$ is:

$$T_b = \frac{\sum_{k=0}^{N/2-1} ((T_{Data}[k] - T_{Data}[k+N/2]) \cdot (n[k] - n[k+N/2]))}{\sum_{k=0}^{N/2-1} (n[k] - n[k+N/2])^2}$$

Inserting $\tilde{T}_b$ as defined above in $$T_{Clk} = \frac{1}{N} \sum_{k=0}^{N/2-1} (T_{Data}[k] - n[k] \cdot T_b)$$

yields the clock signal timing $\tilde{T}_{Clk}$.

No complex calculations are required with the exception of some multiplications. The sums can be continuously updated according to the "first in, first out" (FIFO) principle by subtracting a delayed signal.

The reference position for the data edges and the clock signals must be reinitialized at regular intervals to avoid an overflow. A corresponding correction must be made for the data output from the FIFO memories until reinitialized data is output.

The respective principle is outlined in FIG. 5 for a sum in the following form $g[k]=\sum_{l=k-N/2+1}^{k}(x[l-N/2]-x[l])$.

Figure 5:
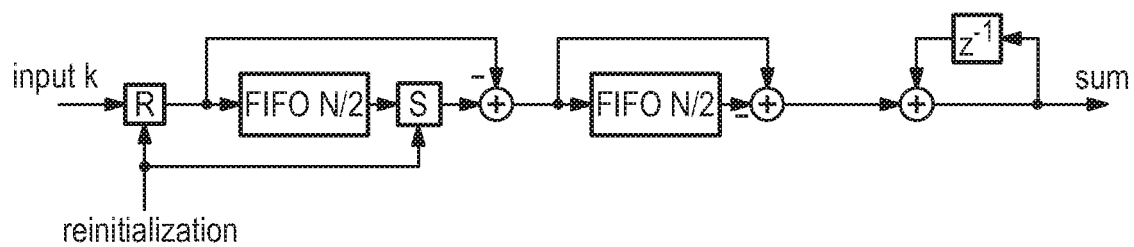
FIG. 5 schematically shows a block diagram of a reinitialization of a reference position of data edges.

As shown in FIG. 5, the R block performs the reinitialization at the input and the S block the correction of the data from the FIFO memory.

As already described, the modules may be established by software modules so that a computer program 32 is provided that may be used by the clock recovery module 10. The computer program 32 has a program code configured to cause the clock recovery module 10 to perform the steps mentioned above when the computer program 32 is run on the clock recovery module 10. In some embodiments, the computer program includes program code or suitable instructions that when executed on one or more computing devices, such as FPGA, ASIC, microprocessor, etc., carry out one or more of the method steps of Claims 1-11.

In the clock recovery method described above, the full clock signal, i.e. all clock timings are recovered based on the accumulated data edges. For high data rates, i.e. high clock signal frequencies, this approach may become rather computationally intensive.

In the clock recovery method described above, all clock signal timings are all recovered directly based on data edges of the data signal, which may require rather high computational resources. Thus, the production costs are increased if the clock recovery shall be done solely in hardware.

In order to achieve a high processing speed combined with reduced production costs, the clock recovery module 10 described above can be adapted as described in the following.

Figure 7:
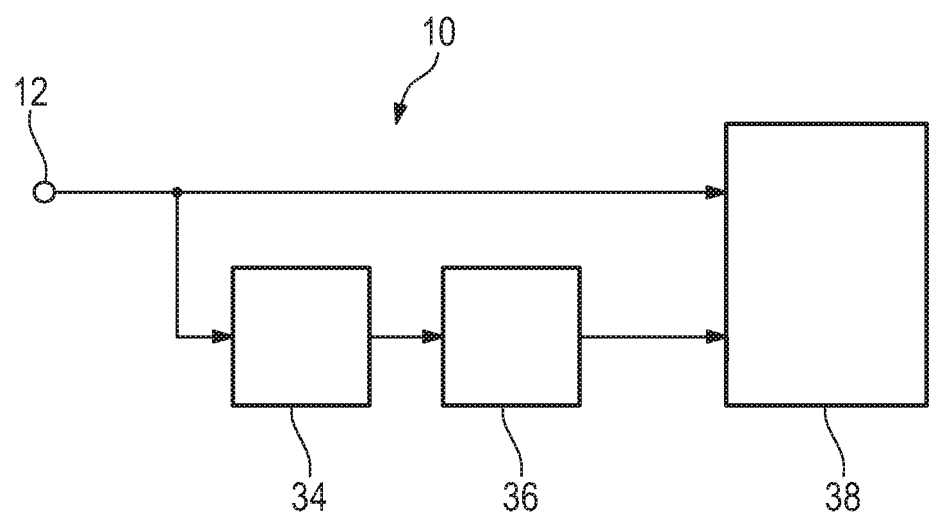
FIG. 7 schematically shows a representative clock recovery module according to an embodiment of the present disclosure.

FIG. 7 shows a block diagram of the adapted clock recovery circuit or module 10. The clock recovery module 10 comprises an input 12, a partial clock recovery module 34 and an interpolation module 36. Generally speaking, the clock recovery module 10 may be integrated into a test instrument, for example into an oscilloscope and/or into a vector network analyzer.

The partial clock recovery module 34 is connected to the input 12 downstream of the input 12 such that a data signal to be processed is received via the input 12 and forwarded to the partial clock recovery module 34. The interpolation module 36 is connected to the partial clock recovery module 34 downstream of the partial clock recovery module 34.

The partial clock recovery module 34 is established as a hardware module. More precisely, the partial clock recovery module 14 may comprise field programmable gate arrays (FPGAs) and/or application specific integrated circuits (ASICs) that are configured to perform at least some of the steps of the second embodiment of the clock recovery method described below.

The interpolation module 36 is established as a software module. Thus, the interpolation module 36 may be established as a computer program that is executed on a processing unit, for example on a central processing unit or a graphics processor. Alternatively or additionally, the interpolation module 36 may be established as a hardware circuit or module.

Generally speaking, the clock recovery module 10 is configured to receive a data signal via the input 12 and to recover a clock signal from the data signal. The data signal comprises a symbol sequence, wherein each symbol has a pre-defined symbol duration and one of at least two different symbol values. The data signal may be PAM-n coded, wherein n is an integer bigger than 1. Thus, each symbol has one of n different symbol values.

In some embodiments, the data signal may be a binary signal, i.e. the data signal may be PAM-2 coded. In this case, each symbol is a bit having one of two different possible bit values, for example 0 and 1.

Figure 8:
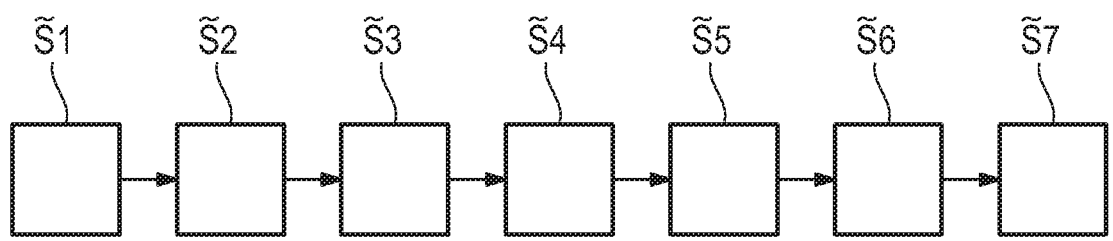
FIG. 8 shows a block diagram of a representative clock recovery method according to an embodiment of the present disclosure.

In the following, a second embodiment of a clock recovery method for recovering the clock signal from the data signal by using the clock recovery module 10 shown in FIG. 7 is described with reference to FIG. 8. This method may also be called a clock data recovery (CDR).

The data signal is received via the input 12 and forwarded to the hardware partial clock recovery module 34 (step $\tilde{S}1$).

The partial clock recovery module 34 determines signal edge timings of signal edges of the data signal (step $\tilde{S}2$).

Figure 9:
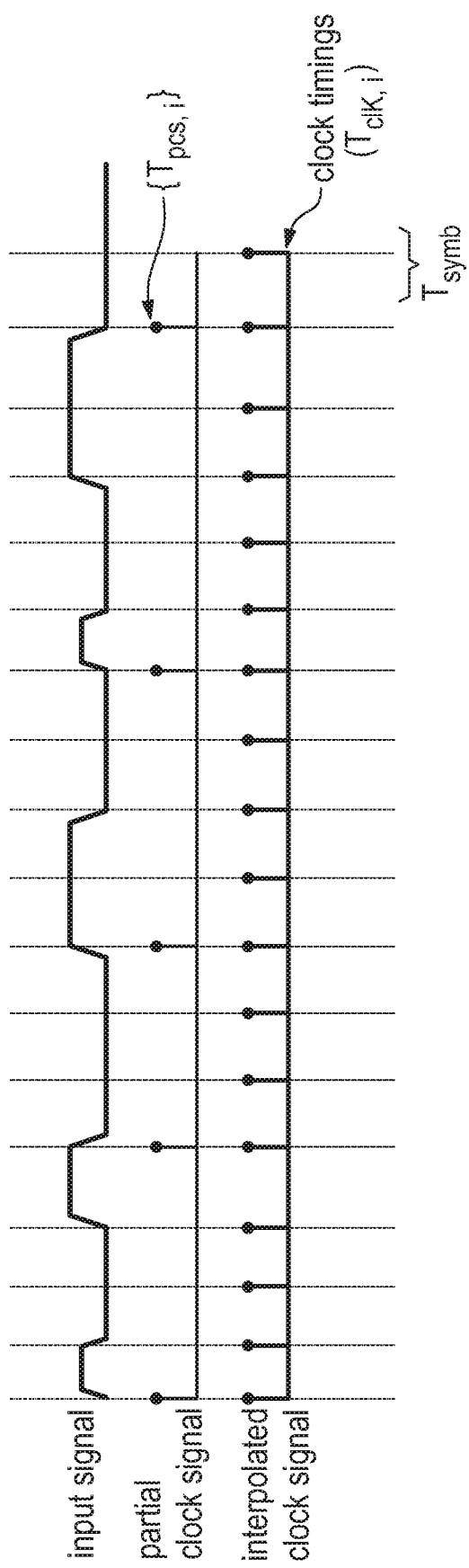
FIG. 9 shows a diagram of an input signal, a partial clock signal and an interpolated clock signal plotted against time, respectively.

As already explained above, each symbol has one of n different symbol values. FIG. 9 shows the example of a PAM-2 coded signal, wherein the symbols each have a predetermined symbol duration $T_{sym}$. Without loss of generality, this PAM-2 coded data signal will be used as an example below.

A signal edge occurs when two consecutive symbols (or rather bits in the example of FIG. 9) have different values. The signal edge timings are detected by defining thresholds for distinguishing the different values of the individual symbols and by determining the times when the data signal crosses or intersects the thresholds.

Figure 10:
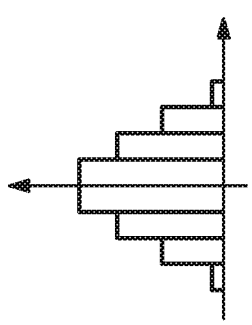
FIG. 10 shows an exemplary histogram of signal edge timings.

Several histograms are determined, wherein each histogram is associated with a preliminary set of partial clock timings $\{T_{pcs,i}\}$ (step $\tilde{S}3$), also cf. FIGS. 9 and 10.

The partial clock timings each coincide with one respective clock timing, but there are more clock timings $T_{clk,i}$ (cf. FIG. 9) than there are partial clock timings. More precisely, usually there are one or more clock timings between each pair of consecutive partial clock timings. However, in exceptional cases, there may be no clock timing between a pair of consecutive partial clock timings.

Generally speaking, the histograms each describe deviations of the partial clock timings from their supposed temporal positions. More precisely, the at least one histogram is a distribution of the frequentness of deviations of the partial clock signals from their supposed temporal position plotted against the value of the deviation.

The preliminary set of partial clock timings represents a hypothesis about the partial clock signal. If this hypothesis matches the timings defined by the signal edge timings, the mean deviation, for example the mean quadratic error and/or the mean absolute error of the partial clock timings from their supposed temporal position is smaller than in the case if the hypothesis does not match the timings defined by the signal edge timings. Thus, the histogram changes depending on how well the hypothesis matches the timings defined by the signal edge timings.

It is noted that the step of determining the histograms is essentially equivalent to the modulo-operation described above with respect to the first embodiment of the clock recovery module 10.

The histograms are then compared with each other based on at least one characteristic parameter of the histograms (step $\tilde{S}4$).

Generally speaking, the at least one characteristic parameter provides a measure for how well the hypothesis about the partial clock signal matches the timings defined by the signal edge timings.

For example, the at least one characteristic parameter provides a measure of a mean deviation of the hypothetic partial clock timings of the preliminary set of partial clock timings from the timings defined by the signal edge timings.

In some embodiments, the characteristic parameter comprises a mean quadratic error and/or a mean absolute error characterizing a mean deviation of the hypothetic partial clock timings of the preliminary set of partial clock timings from the timings defined by the signal edge timings.

Based on the at least one characteristic parameter, one of the preliminary sets of partial clock timings is chosen (step $\tilde{S}5$). Therein, the preliminary set of partial clock timings being associated with the histogram having an extremal characteristic parameter is chosen. As a result of step $\tilde{S}5$, at least two partial clock timings $T_{pcs,i}$ are obtained.

The characteristic parameter provides a measure for how well the hypothesis about the partial clock signal matches the timings defined by the signal edge timings. Thus, depending on the specific definition of the characteristic parameter, the histogram having the smallest or largest characteristic parameter of all histograms is associated with the hypothesis that matches the timings defined by the signal edge timings best.

As already mentioned above, usually there are one or several clock timings between two consecutive partial clock timings. Thus, there are one or several symbols between two consecutive partial clock timings, each of which symbols has a predetermined symbol duration $T_{symb}$.

This is due to the fact that the partial clock recovery module 34 may have an internal clock operating at a lower frequency than the data rate of the data signal.

The partial clock recovery module 34 determines a number of symbols between the at least two partial clock timings (step $\tilde{S}6$).

The data rate of the data signal usually is not an integer multiple of the internal clock frequency of the partial clock recovery module 34. Thus, there may be a different number of symbols per internal clock cycle of the partial clock recovery module 34 for different internal clock cycles.

The number of symbols between the at least two partial clock timings is determined based on a pre-defined symbol period or based on an estimated symbol period.

If the pre-defined symbol period is employed, the pre-defined symbol period may be loaded from a memory. In this case, a nominal symbol period may be used.

If the symbol period is estimated, the symbol period may be estimated based on the data signal, for example based on the signal edge timings of signal edges of the data signal. In some embodiments, the symbol period may be estimated as already described with respect to the first embodiment of the clock recovery method.

Thus, for estimating the symbol period $\tilde{T}_b$, the minimum of the following criterion (for even N) may be determined:

$$L_1(T_b) = \sum_{k=0}^{N/2-1} ((\tilde{T}_{Data}[k] - \tilde{T}_{Data}[k+N/2]) - (n[k] - n[k+N/2]) \cdot T_b)^2$$

The symbol period $\tilde{T}_b$ then is given by:

$$T_b = \frac{\sum_{k=0}^{N/2-1} ((\tilde{T}_{Data}[k] - \tilde{T}_{Data}[k+N/2]) \cdot (n[k] - n[k+N/2]))}{\sum_{k=0}^{N/2-1} (n[k] - n[k+N/2])^2}$$

For more details of the estimation of the symbol period, reference is made to the explanations given above with respect to the first embodiment of the clock recovery method.

It is emphasized that the steps $\widetilde{S2}$ to $\widetilde{S6}$ described above are all performed by the partial clock recovery module 34, i.e. in hardware.

The at least two partial clock timings determined and the determined number of symbols between the at least two partial clock timings are then forwarded to the interpolation module 36.

The software and/or hardware interpolation module 36 determines the clock timings of the clock signal via an interpolation of the at least two partial clock timings based on the determined number of symbols between the at least two partial clock timings (step $\tilde{S}7$).

For example, the interpolation module 36 determines the clock timings via a linear interpolation of the at least two partial clock timings based on the number of symbols between the at least two partial clock timings.

In other words, if there are m symbols between the at least two partial clock timings, the interpolation module 36 divides the time span between these at least two partial clock signal by inserting m clock signals such that the clock signals are essentially equidistant in time.

Thus, the second embodiment of the clock recovery method described above divides the clock data recovery into a hardware-implemented portion (steps $\widetilde{S2}$ to $\widetilde{S6}$) and a software- and/or hardware-implemented portion (step $\widetilde{S7}$).

As only a partial clock signal is to be determined via the hardware partial clock recovery module 34, namely in the hardware-implemented portion (steps $\widetilde{S2}$ to $\widetilde{S6}$), a high processing speed and lowered production costs can be achieved at the same time.

The determined clock timings, i.e. the recovered clock signal, may then be forwarded to further components 38 of the measurement instrument for further processing.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiment of the invention in which an exclusive property or privilege is claimed are defined as follows:

1. A clock recovery method for recovering a clock signal from a data signal, said data signal comprising a symbol sequence, wherein said clock recovery method comprises:
   receiving said data signal;
   determining at least two partial clock timings of a partial clock signal that is based on said data signal;
   determining the number of symbols between said at least two partial clock timings; and
   determining clock timings of said clock signal based on said at least two partial clock timings and the number of symbols.

2. The method of claim 1, wherein said clock timings are interpolated based on said at least two partial clock timings and said number of symbols.

3. The method of claim 2, wherein said clock timings are linearly interpolated.

4. The method of claim 1, wherein the number of symbols is determined based on at least one of a pre-defined symbol period and an estimated symbol period.

5. The method of claim 1, wherein signal edge timings of said data signal are determined, and wherein said at least two partial clock timings are determined based on said signal edge timings.

6. The method of claim 5, wherein at least one histogram of said signal edge timings is determined, wherein said at least one histogram is associated with a preliminary set of partial clock timings, and wherein said at least two partial clock timings are determined based on said histogram.

7. The method of claim 6, wherein several histograms are determined, wherein each histogram is associated with one of several different preliminary sets of partial clock timings.

8. The method of claim 7, wherein the several histograms are compared with each other based on at least one characteristic parameter of said histograms, and wherein said at least two partial clock timings are determined based on the comparison.

9. The method of claim 8, wherein said at least two partial clock timings are determined based on the histogram having an extremal characteristic parameter.

10. The method of claim 5, wherein said signal edge timings of said data signal, said at least two partial clock timings and/or said number of symbols are determined via a hardware partial clock recovery module.

11. The method of claim 1, wherein said clock timings of said clock signal are determined via a software interpolation module.

12. A clock recovery module for recovering a clock signal from a data signal, said data signal comprising a symbol sequence, the clock recovery module comprising:
a partial clock recovery circuit and an interpolation circuit,
said partial clock recovery circuit being configured to determine at least two partial clock timings of a partial clock signal based on said data signal,
said partial clock recovery circuit being configured to determine the number of symbols between said at least two partial clock timings; and
said interpolation circuit being configured to determine clock timings of said clock signal based on said at least two partial clock timings and the number of symbols.

13. The module of claim 12, wherein said interpolation circuit is established as a software module.

14. The module of claim 12, wherein said interpolation circuit is configured to interpolate said clock timings based on said at least two partial clock timings and the number of symbols.

15. The module of claim 12, wherein said partial clock recovery circuit is configured to determine signal edge timings of said data signal.

16. The module of claim 15, wherein said partial clock recovery circuit is established as a hardware module.

17. The module of claim 15, wherein said partial clock recovery circuit is configured to determine at least one histogram of said signal edge timings, said at least one histogram being associated with a preliminary set of partial clock timings, and wherein said at least two partial clock timings are determined based on said histogram.

18. The module of claim 17, wherein said partial clock recovery circuit is configured to determine several histograms, wherein each histogram is associated with one of several different preliminary sets of partial clock timings.

19. The module of claim 18, wherein said partial clock recovery circuit is configured to compare said several histograms based on at least one characteristic parameter of said histograms.

20. The module of claim 19, wherein said partial clock recovery circuit is configured to determine said partial clock signal based on the comparison.

* * * * *